United States Patent [19]

Nakamura et al.

[11] 4,319,226

[45] Mar. 9, 1982

[54] SIGNAL CONVERTER UTILIZING TWO CLOCK SIGNALS

[75] Inventors: Hideo Nakamura, Tokyo; Katsuaki Takagi, Kokubunji; Tsuneo Funabashi, Hachioji, all of Japan

[73] Assignee: Hitachi, Ltd., Tokyo, Japan

[21] Appl. No.: 26,768

[22] Filed: Apr. 3, 1979

[30] Foreign Application Priority Data

Apr. 7, 1978 [JP] Japan ................... 53-40324

[51] Int. Cl.$^3$ .................. G06F 7/38; H03K 13/02
[52] U.S. Cl. ................... 340/347 NT; 235/92 T; 235/92 TF; 340/347 AD; 340/347 M
[58] Field of Search .... 340/347 M, 347 AD, 347 CC; 235/92 TF, 92 FQ

[56] References Cited

U.S. PATENT DOCUMENTS 3,541,446  11/1970  Prozeller ................ 340/347 CC X
4,143,362  3/1979   Ulmer ...................... 340/347 NT Primary Examiner—Thomas J. Sloyan
Attorney, Agent, or Firm—Craig and Antonelli

[57] ABSTRACT

A signal converter includes a generator for generating first and second clock signals having recurrence periods equal to each other and phases different from each other, an input for receiving as a signal to be converted a signal which has signal levels not lower than a predetermined level during an arbitrary period of time, a counter for counting the first clock signals from the generator in a period of time corresponding to the signal period of time, and an output arrangement. The output arrangement provides for delivering either of two signals in dependence on which of time intervals determined by the first and second clock signals an end of said signal period of time lies in, whereby signals of the counter and the output arrangement are used as a converted signal.

8 Claims, 6 Drawing Figures

4,319,226

SIGNAL CONVERTER UTILIZING TWO CLOCK SIGNALS

BACKGROUND OF THE INVENTION

The present invention relates to a signal converter which generates a digital signal corresponding to the pulse width of an input signal. More particularly, it relates to a signal converter which is suitable for use as an analog/digital converter.

A known analog/digital converter (hereinbelow, abbreviated to "A/D converter") provides for an analog input voltage to be stored in a capacitor. The stored charge is subsequently discharged under a constant current, and the number of clock pulses which are generated during the period of time from the initiation of the discharge until the terminal voltage of the capacitor lowers to a certain threshold value is counted by a counter, thereby to produce a digital signal corresponding to the amplitude of the analog input voltage. With such a prior-art A/D converter, in order to enhance the conversion accuracy, it is necessary to shorten the period of the clock pulses or to lower the discharge speed. However, it is impossible to make the period of the clock pulses shorter than a certain value and the lowering of the discharge speed presents the problem that the conversion speed becomes slow.

SUMMARY OF THE INVENTION

An object of the present invention is to provide a signal converter which enhances the conversion accuracy remarkably without lowering the conversion speed.

In order to accomplish such an object, according to this invention, in case of delivering a count value which corresponds to an input signal that has a signal level of or above a predetermined level during only a period from a first time to a second time, first and second clocks which have recurrence periods equal to each other and phases different from each other are used, the first clocks are counted by counter means during a time interval from the first time to a time which is later than the second time and which is synchronous with the first clock, a signal is delivered which corresponds to whether or not the second clock is existent within a time interval till a time that is later than the second time and that is synchronous with the first clock, and the conversion output is obtained from the count result of the first clocks by the counter means and the output signal on the existence of the second clock.

Other objects, features and advantages of the present invention will become more apparent from the following description taken in conjunction with the accompanying drawings.

DETAILED DESCRIPTION OF THE PRIOR ART

Figure 1:
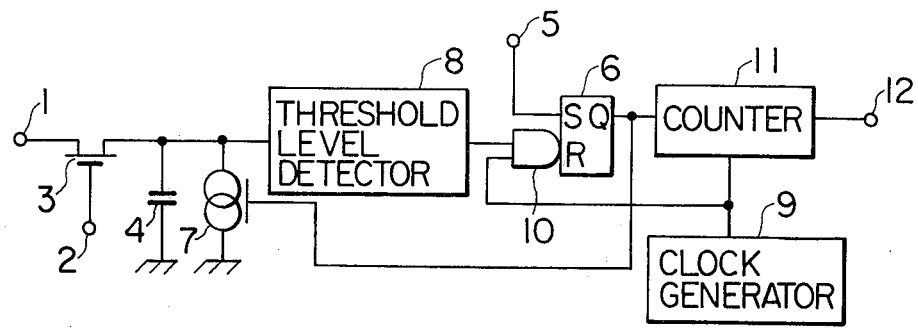
FIG. 1 is a block diagram of a prior-art signal converter.
Figure 2:
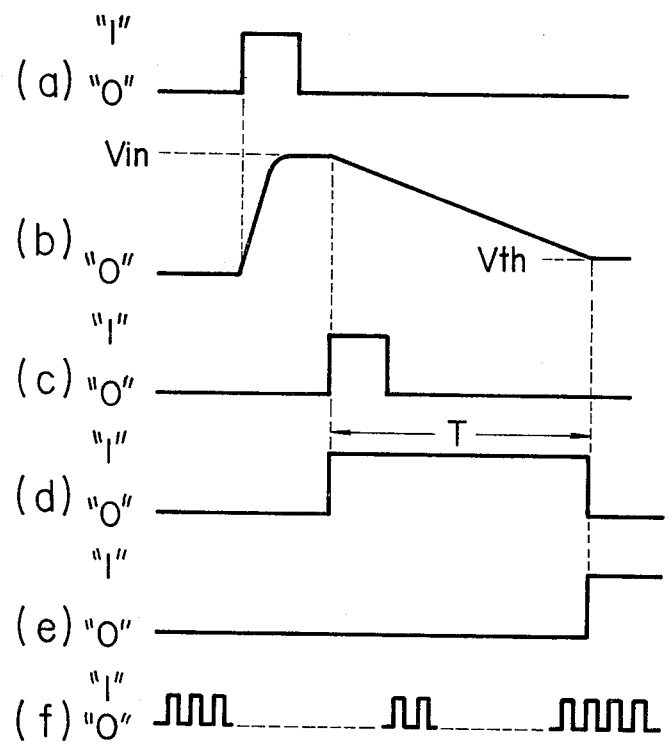
FIG. 2 is a signal waveform diagram for explaining the operation of the signal converter in FIG. 1.

FIG. 1 shows the conventional construction of a count type A/D converter, while FIG. 2 shows operating waveforms at various parts in the converter of FIG. 1.

In the circuit arrangement of FIG. 1, an analog input voltage $V_{in}$ is applied to an input terminal 1. When a switch 3 formed of a MOS transistor is closed by an "on" signal at a control terminal 2, as illustrated at (a) in FIG. 2, a voltage equal to the input voltage $V_{in}$ is stored or charged in a capacitor 4 as illustrated at (b) in FIG. 2. Under this state, the switch 3 opened, and a "start" signal illustrated at (c) in FIG. 2 is received at a control terminal 5. Then, a flip-flop 6 is set as illustrated at (d) in FIG. 2 and a constant current circuit 7 is operated by the output of the Q terminal of the flip-flop with the charges stored in the capacitor 4 being discharged. In this case, owing to the function of the constant current circuit 7, the terminal voltage of the capacitor 4 decreases under a fixed gradient as illustrated at (b) in FIG. 2. When the terminal voltage of the capacitor 4 has lowered to a threshold voltage $V_{th}$, a logic "1" signal is delivered from a threshold level detector 8, as illustrated at (e) in FIG. 2, to an AND gate 10. When the "1" signal of a clock signal $\phi$ from a clock generator 9, as illustrated at (f) in FIG. 2, is applied in synchronism, the AND gate 10 is enabled, and the flip-flop 6 is reset. Accordingly, the set period T of the flip-flop 6 corresponds to the input voltage $V_{in}$.

Using the set signal of the flip-flop 6 as the carry input of a counter 11, the number of the clock signals $\phi$ delivered from the clock generator 9 during the set period T is counted by the counter 11. The count result is obtained at an output terminal 12 as a digital signal. Accordingly, this digital output corresponds to the analog input voltage $V_{in}$.

In such an A/D converter, where the discharge speed and the detector accuracy are high, the conversion accuracy is determined by the resolving power of the counter. In the prior-art A/D converter described above, the counter has the resolving power of 1 clock time. In order to raise the conversion accuracy, therefore, the clock period may be shortened. This measure, however, is subject to limitation. Although it is also considered possible to lower the discharge speed, the conversion speed becomes low in this case.

DETAILED DESCRIPTION OF THE PREFERRED EMBODIMENTS

Figure 3:
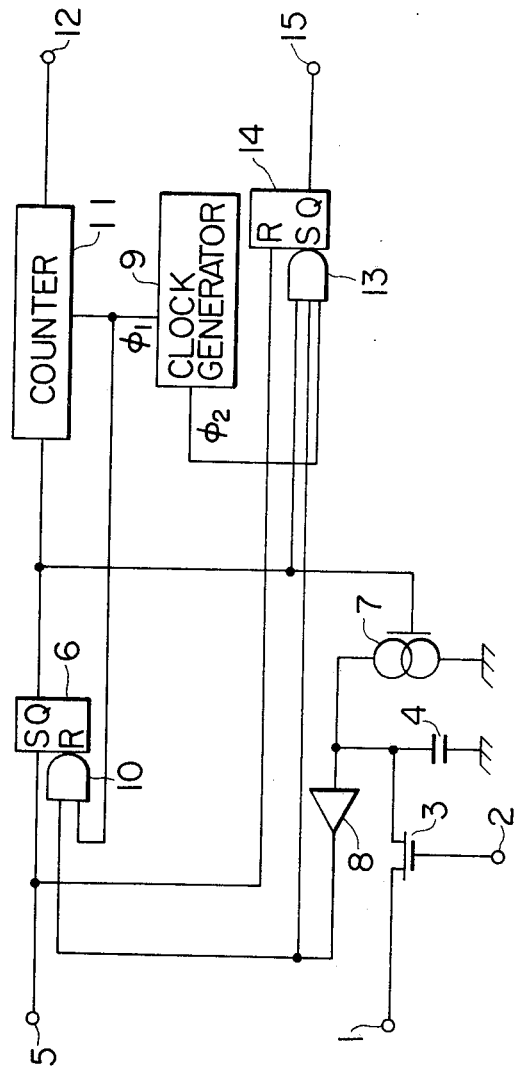
FIG. 3 is a block diagram of an embodiment of a signal converter according to the present invention.

FIG. 3 shows the construction of an embodiment of the signal converter according to this invention, and exemplifies an A/D converter.

In FIG. 3, reference numerals 1 to 12 designate like parts as in FIG. 1, while reference numeral 13 designates an AND gate, reference numeral 14 a flip-flop, and reference numeral 15 an output terminal. Two clock signals, as will be described later, are produced from the clock generator 9.

The threshold level detector 8 may fundamentally be an inverter, and is put into a multistage construction in order to enhance the gain. The threshold level detector 8 can be replaced with a conventional comparator.

As the constant current circuit 7, a circuit in which a conventional constant-current source and a switching element adapted to be turned "on" and "off" by the outputs of the flip-flop 6 are connected in series can be used.

Figure 4:
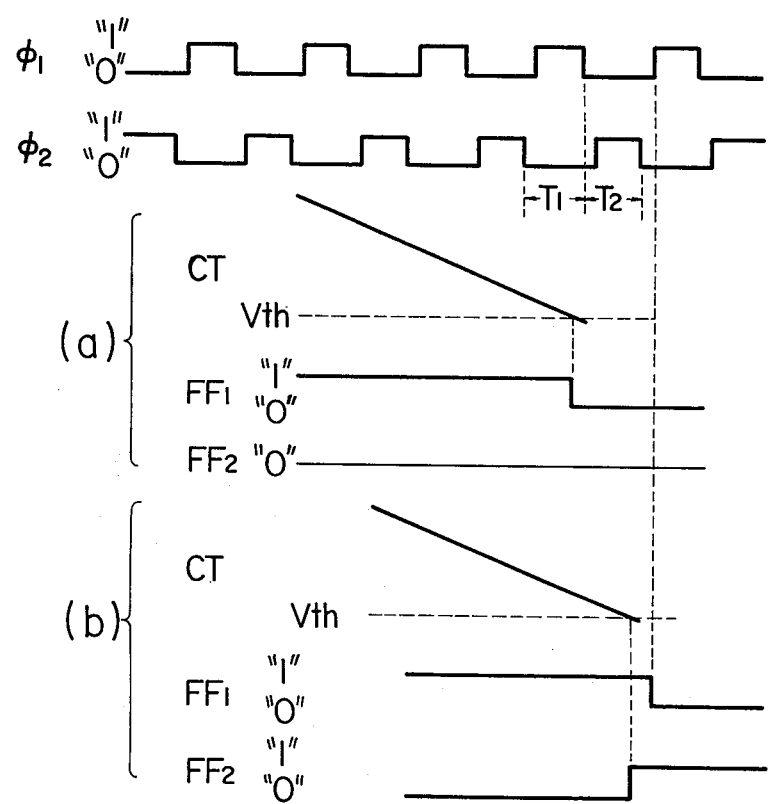
FIG. 4 is a signal waveform diagram for explaining the operation of the embodiment in FIG. 3.

FIG. 4 is a signal waveform diagram for explaining the operation of the circuit in FIG. 3. The symbols $\phi_1$ and $\phi_2$ indicate the clock signals which are produced from the clock generator 9 and (a) and (b) illustrate signal waveforms in two states. In the illustration, CT indicates the terminal voltage of the capacitor 4, and FF$_1$ and FF$_2$ indicate the output signals of the respective flip-flops 6 and 14.

The embodiment of this invention shown in FIGS. 3 and 4 is characterized by using the clock signals $\phi_1$ and $\phi_2$ which are generated from the clock generator 9 and which have recurrence periods equal to each other and phases shifted substantially 180° from each other, as illustrated in FIG. 4. The AND gate 13 is arranged so as to receive as its inputs, the output of the flip-flop 6, the output of the threshold level detector 8 and the clock signal $\phi_2$, and the flip-flop 14 is arranged to be reset by the "start" signal from the control terminal 5 and to be set by the output of the AND gate 13 so that the outputs of the counter 11 and the flip-flop 14 are employed as the count outputs or digital outputs.

Hereunder, the operation of the embodiment in FIG. 3 will be described in detail with reference to FIG. 4.

The operation of the embodiment is the same as the operation of the prior art in FIG. 1 in that the analog input voltage from the input terminal 1 is charged in the capacitor 4 through the switch 3, and that the flip-flop 6 is set by the "start" signal from the input terminal 5, to start discharging the stored charges of the capacitor 4 by means of the constant current circuit 7. In the circuit of FIG. 3, the flip-flop 14 is reset by the "start" signal.

When the terminal voltage of the capacitor 4 has lowered to the threshold voltage $V_{th}$, the output of the detector becomes "1". Depending on the states of the clock signal $\phi_1$ and $\phi_2$ at that time, the status as shown at (a) or (b) in FIG. 4, is established.

More specifically, (a) in FIG. 4 exemplifies a case where the terminal voltage of the capacitor 4 has reached the threshold level $V_{th}$ in a time interval $T_1$ from the fall of the clock signal $\phi_2$ to the fall of the clock signal $\phi_1$. In this case, at the time when the terminal voltage has reached the threshold level, the flip-flop 6 is reset by the clock signal $\phi_1$ as seen from the waveform FF$_1$ shown at (a) of FIG. 4. The setting of the flip-flop 14 is inhibited, and the output thereof holds the reset state as seen from the waveform FF$_2$ shown at (a) of FIG. 4.

On the other hand, (b) in FIG. 4 exemplifies a case where the threshold level $V_{th}$ has been reached in a time interval $T_2$ from the fall of the clock signal $\phi_1$ to the fall of the clock signal $\phi_2$, as seen from the waveform FF$_2$ at (b) of FIG. 4, and the flip-flop 6 is subsequently reset by the clock signal $\phi_1$, as seen from the waveform FF$_1$.

The output of the flip-flop 14 and the output of the counter 11, as thus obtained, are delivered from the output terminals 15 and 12, as the first digit (the least significant bit) and as the second and upper digits, respectively. In this way, assuming that the count value of the counter 11 is n, a digital output of 2·n is obtained in the case of (a) in FIG. 4, and a digital output of (2·n + 1) is obtained in the case of (b) in FIG. 4. Accordingly, the output of the counter 11 and the flip-flop 14 has a resolving power of ½ clock time, which is ½ of the minimum resolution in the prior art.

The clock signals $\phi_1$ and $\phi_2$ may be any pulse trains insofar as they have such pulse widths that they do not overlap each other. The phase shift between the clock signals $\phi_1$ and $\phi_2$ does not need to be exactly 180°. In a case where the phase shift deviates from 180°, the conversion accuracy is somewhat inferior to that in the case of the phase difference of 180°, but it is higher than that of the prior-art signal converter.

The charging and discharging circuit is not restricted to the illustrated example, but it may be of any construction. Further, an integrator which does not employ any charging and discharging circuit may be used. Essentially, any device adapted to convert the input voltage into the corresponding time may be used.

Although the embodiment of FIG. 3 has been described as resetting the flip-flop 14 by the "start" signal, any signal which is generated before the threshold voltage is reached may be employed. The signal for operating the constant current circuit 7 does not need to be the output of the flip-flop 6, but it may be any signal which continues from the time of the starting till, at least, the arrival at the threshold voltage. Further, the flip-flops 6 and 14 may be replaced with any devices which provide a signal and which provide a signal of a certain level in response to one input signal and which provides a signal of a different level in response to the other input signal. Still further, any devices may be employed instead of the AND gates 10 and 13 insofar as they provide a signal of a predetermined level in the presence of a plurality of input signals.

Figure 5:
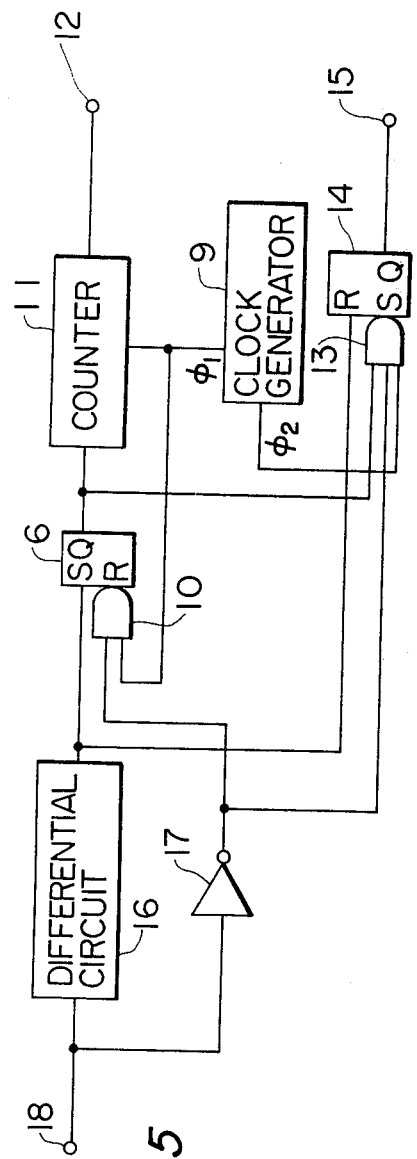
FIG. 5 is a block diagram of another embodiment according to the present invention.

FIG. 5 shows the construction of another embodiment of the signal converter according to this invention, and exemplifies a converter for generating a signal corresponding to the pulse width of an input signal.

In FIG. 5, reference numeral 16 designates a differentiation circuit, reference 17 an inverter, and reference numeral 18 an input terminal for an input pulse having an arbitrary pulse width, while the other reference numerals designate like parts, as in FIG. 3.

Figure 6:
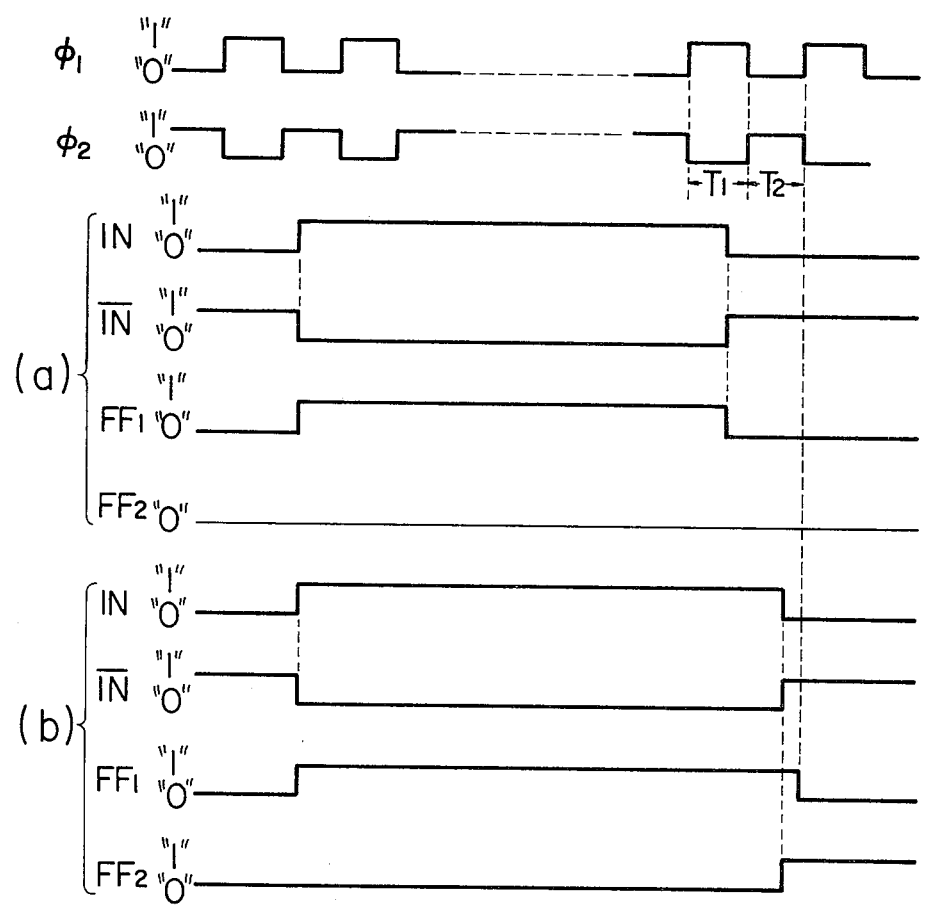
FIG. 6 is a signal waveform diagram for explaining the operation of the embodiment in FIG. 6.

FIG. 6 is a signal waveform diagram for explaining the operation of the circuit in FIG. 5. The symbols $\phi_1$ and $\phi_2$ indicate the clock signals from the clock generator 9 and (a) and (b) illustrate signal waveforms in respectively different states. In the illustration, IN indicates an input signal from the input terminal 18, IN indicates an output signal of the inverter 17, and FF$_1$ and FF$_2$ indicate output signals of the flip-flops 6 and 14, respectively.

When, in the circuit of FIG. 5, the pulse signal having an arbitrary pulse width is received at the input terminal 18, a differential pulse is provided from the differentiation circuit 16 at the rise of the input pulse signal, and it sets the flip-flop 6 and resets the flip-flop 14. On the other hand, the inverted signal of the input pulse is provided from the inverter 17, and it is applied to the AND gates 10 and 13.

If the fall of the input pulse IN lies in a time interval $T_1$ between the fall of the clock signal $\phi_2$ and the fall of the clock signal $\phi_1$, as illustrated at (a) in FIG. 6, the flip-flop 6 is reset and the set of the flip-flop 14 is inhibited as stated previously. If the fall of the input pulse IN lies in a time interval $T_2$ between the fall of the clock signal $\phi_1$ and the fall of the clock signal $\phi_2$, as illustrated at (b) in FIG. 6, the flip-flop 14 is set earlier, and the flip-flop 6 is subsequently resent.

Accordingly, the output at the output terminals 12 and 15 can have the conversion accuracy enhanced remarkably as in the foregoing embodiment.

In the circuit arrangements of FIGS. 3 and 5, a construction in which the clock signals are put into the counter 11 for a predetermined period of time and the number of the clock signals is counted is also possible.

As set forth above, according to this invention, the two types of clock signals are used, whereby the conversion accuracy can be conspicuously enhanced without lowering the conversion speed by means of the very simple construction.

While we have shown and described various embodiments in accordance with the present invention, it is understood that the same is not limited thereto but is susceptible of numerous changes and modifications as known to those skilled in the art and we therefore do not wish to be limited to the details shown and described herein, but intend to cover all such changes and modifications as are encompassed by the scope of the appended claims.

We claim:

1. A signal converter for converting a time signal having a predetermined level during an arbitrary signal period of time into a digital signal comprising generator means for generating first and second clock signals having recurrence periods equal to each other and phases different from each other, input means for receiving the time signal having the predetermined level during the arbitrary signal period of time, counter means for counting the first clock signals from said generator means in a period of time corresponding to the signal period of time, and output means for delivering either of two signals in dependence on which of time intervals determined by the first and second clock signals an end of said signal period of time lies in, whereby a signal corresponding to the sum of twice the contents of said counter means and the signal of said output means is used as the digital signal.

2. A signal converter according to claim 1, wherein said input means includes means for converting an analog input signal into a time signal which has a time width corresponding to an amplitude of the input signal.

3. A signal converter according to claim 1, wherein said first and second clock signals have a phase difference of substantially 180° therebetween.

4. A signal converter for converting a time signal having a predetermined level during an arbitrary signal period of time into a digital signal comprising generator means for generating first and second clock signals having recurrence periods equal to each other and phases different from each other, input means for receiving the time signal having the predetermined level during the arbitrary signal period of time from a first time to a second time, first circuit means responsive to signals from said generator means and said input means and for delivering a predetermined signal from said first time to a time later than said second time and synchronous with the first clock signal, counter means and for counting a number of the first clock signals during the delivered period of said predetermined signal, and second circuit means responsive to said generator means, said input means and said first circuit means and for delivering a predetermined signal in synchronism with the second clock signal within said delivered period of the first-mentioned predetermined signal after said second time, whereby a signal corresponding to the sum of twice the contents of said counter means and the signal of said second circuit means is used as the digital signal.

5. A signal converter according to claim 4, wherein said first circuit means comprises first gate means for generating an output in synchronism with the first clock signal after said second time, and first flip-flop means being set at said first time and being reset by said output of said first gate means, and wherein said second circuit means comprises second gate means for generating an output in synchronism with the second clock signal within the set period of said first flip-flop means after said second time, and second flip-flop means being set by said output of said second gate means and being reset at said first time.

6. A signal converter according to claim 4, wherein said input means includes means for converting an analog input signal into a time signal which has a time width corresponding to an amplitude of the input signal.

7. A signal converter according to claim 6, wherein the converter means comprises a capacitor into which the analog input signal is charged at a predetermined time, a constant current source which discharges the charges stored in said capacitor, after said first time, and detector means for detecting said second time at which a terminal voltage of said capacitor lowers to a predetermined threshold value.

8. A signal converter according to claim 4, wherein said first and second clock signals have a phase difference of substantially 180° therebetween.

* * * * *